(12) United States Patent
Shan et al.

(10) Patent No.: US 10,424,667 B2
(45) Date of Patent: Sep. 24, 2019

(54) THIN FILM TRANSISTOR WITH A PROTECTIVE LAYER, AND MANUFACTURING METHOD THEREFOR, DISPLAY PANEL AND DISPLAY APPARATUS

(71) Applicant: KUNSHAN NEW FLAT PANEL DISPLAY TECHNOLOGY CENTER CO., LTD., KunShan, Jiangsu (CN)

(72) Inventors: Qi Shan, KunShan (CN); Kun Hu, KunShan (CN); Li Lin, KunShan (CN); Song Liu, KunShan (CN)

(73) Assignee: KUNSHAN NEW FLAT PANEL DISPLAY TECHNOLOGY CENTER CO., LTD., Kunshan, Jiangsu (CN)

( * ) Notice: Subject to any disclaimer, the term of this patent is extended or adjusted under 35 U.S.C. 154(b) by 0 days.

(21) Appl. No.: 16/066,796

(22) PCT Filed: Feb. 27, 2017

(86) PCT No.: PCT/CN2017/075001
§ 371 (c)(1),
(2) Date: Jun. 28, 2018

(87) PCT Pub. No.: WO2017/148348
PCT Pub. Date: Sep. 8, 2017

(65) Prior Publication Data
US 2019/0027610 A1  Jan. 24, 2019

(30) Foreign Application Priority Data
Feb. 29, 2016 (CN) .......................... 2016 1 0111984

(51) Int. Cl.
*H01L 29/786* (2006.01)
*H01L 27/32* (2006.01)
(Continued)

(52) U.S. Cl.
CPC .... *H01L 29/78606* (2013.01); *H01L 27/1248* (2013.01); *H01L 27/3258* (2013.01);
(Continued)

(58) Field of Classification Search
CPC ........... H01L 29/78606; H01L 27/3262; H01L 29/78603; H01L 29/66742
See application file for complete search history.

(56) References Cited

U.S. PATENT DOCUMENTS

| 5,828,084 A | 10/1998 | Noguchi et al. |
| 2008/0073647 A1 | 3/2008 | Arasawa et al. |

(Continued)

FOREIGN PATENT DOCUMENTS

| CN | 1527115 A | 9/2004 |
| CN | 101241915 A | 8/2008 |

(Continued)

*Primary Examiner* — Dung A. Le
(74) *Attorney, Agent, or Firm* — Muncy, Geissler, Olds & Lowe, P.C.

(57) ABSTRACT

A thin film transistor with a protective layer is disclosed. The thin film transistor includes an active region (11), a gate insulating layer (12), a gate (13), a source (14) and a drain (15), a passivation layer (16), and a planarization layer (17) that are successively formed on a flexible substrate (10), wherein a protective layer (18) is formed between the passivation layer (16) and the planarization layer (17), and located directly above the active region (11) and the gate (13), and wherein the protective layer is made of metal and covers part of the active region in a direction perpendicular to the gate, the protective layer completely covering a gap between the gate and the source as well as a gap between the gate and the drain, and not completely covering the gate.

5 Claims, 1 Drawing Sheet

(51) Int. Cl.
*H01L 29/66* (2006.01)
*H01L 51/00* (2006.01)
*H01L 27/12* (2006.01)

(52) U.S. Cl.
CPC .... *H01L 27/3262* (2013.01); *H01L 29/66742* (2013.01); *H01L 29/78603* (2013.01); *H01L 51/0097* (2013.01); *H01L 2251/5338* (2013.01)

(56) References Cited

U.S. PATENT DOCUMENTS

| | | | |
|---|---|---|---|
| 2008/0237805 A1 | 10/2008 | Ohnuma | |
| 2011/0227851 A1* | 9/2011 | Oh | G02F 1/13338 345/173 |
| 2013/0112984 A1* | 5/2013 | Kim | H01L 51/0096 257/72 |
| 2013/0320346 A1* | 12/2013 | Woo | H01L 33/36 257/59 |
| 2014/0091390 A1* | 4/2014 | Hung | H01L 27/1248 257/347 |
| 2014/0183476 A1 | 7/2014 | Kwon et al. | |
| 2015/0171366 A1* | 6/2015 | Kim | H01L 51/5246 257/40 |
| 2016/0190222 A1* | 6/2016 | Chen | H01L 27/322 257/40 |
| 2016/0359054 A1* | 12/2016 | Fang | H01L 27/1225 |

FOREIGN PATENT DOCUMENTS

| | | |
|---|---|---|
| CN | 103500756 A | 1/2014 |
| CN | 103545320 A | 1/2014 |
| CN | 103681869 A | 3/2014 |
| CN | 203503661 U | 3/2014 |
| CN | 103824807 A | 5/2014 |
| CN | 104103669 A | 10/2014 |
| CN | 104282696 A | 1/2015 |
| CN | 104425550 A | 3/2015 |
| CN | 104795403 A | 7/2015 |
| EP | 1435661 A2 | 7/2004 |
| EP | 2071627 A2 | 6/2009 |
| EP | 2731155 A2 | 5/2014 |
| JP | 2004214683 A | 7/2004 |
| JP | 2008103706 A | 5/2008 |
| KR | 20040061656 A | 7/2004 |
| KR | 20150026709 A | 3/2015 |

* cited by examiner

THIN FILM TRANSISTOR WITH A PROTECTIVE LAYER, AND MANUFACTURING METHOD THEREFOR, DISPLAY PANEL AND DISPLAY APPARATUS

TECHNICAL FIELD

The present invention relates to the field of flexible displays, and in particular, to a thin film transistor and a manufacturing method thereof, a display panel, and a display apparatus.

BACKGROUND

An organic light-emitting device, namely, an organic light-emitting diode (OLED), also called an organic electroluminescence display, has an all-solid-state feature, good mechanical property, and strong shock resistance; and uses a plastic or polyester film or sheet as a substrate. An OLED screen can be made thinner, and even can be folded or rolled up, to achieve flexible soft screen display.

With the development of display technology, research and development engineers continuously make improvements in flexible display apparatuses that can be folded or rolled up. Compared with traditional rigid display apparatuses (that is, display apparatuses fabricated on an inflexible substrate such as glass), the flexible display apparatuses have many advantages such as lighter weight, smaller size, more convenient carrying, higher impact resistance, and stronger shock resistance.

However, when the flexible display apparatus is bent, many defects can occur at the interface of the multilayer structure because of differences in Young's modulus between the layers, affecting the device performance. A thin film transistor is an important functional device in the flexible display apparatus, and therefore its performance has a significant influence on the overall performance of the flexible product. In the prior art, the thickness of a high-hardness film layer is reduced generally by optimizing the device structure, to make the hardness of adjacent structural film layers as close to each other as possible, thus reducing the damage to the functional layer. However, the thickness change of the material in different layers of the thin film transistor may have an effect on the performance of the thin film transistor, so that a final product fails to achieve its desired effect.

Therefore, there is an urgent need to provide a method for preventing damage to a thin film transistor device during bending.

SUMMARY OF THE INVENTION

Objectives of the present invention are to provide a thin film transistor and a manufacturing method thereof, a display panel, and a display apparatus, so as to protect the semiconductor material within the thin film transistor covered by the protective layer, reduce the stress on part of the materials of the thin film transistor, and avoid damage to the semiconductor material during bending of the thin film transistor device.

To achieve the foregoing objectives, the present invention provides a thin film transistor. The thin film transistor comprises an active region, a gate insulating layer, a gate, a source and a drain, a passivation layer, and a planarization layer that are successively formed on a flexible substrate, wherein a protective layer is provided between the passivation layer and the planarization layer, the protective layer located right above the active region and the gate.

Alternatively, in the thin film transistor, the protective layer is located right above the active region and the gate, and completely covers the gate.

Alternatively, in the thin film transistor, the protective layer is made of an organic material.

Alternatively, in the thin film transistor, the protective layer is made of metal.

Alternatively, in the thin film transistor, the protective layer covers gaps between the gate and the source as well as between the gate and the drain in a direction perpendicular to the gate.

Alternatively, in the thin film transistor, the protective layer has a Young's modulus of greater than 300 $N/m^2$.

Alternatively, the thin film transistor further comprises: an upper protective film, a lower protective film, and a barrier film, wherein the upper protective film is provided over the planarization layer, the lower protective film is provided below the flexible substrate, and the barrier film is provided between the flexible substrate and the gate insulating layer.

Accordingly, the present invention also provides a method for manufacturing a thin film transistor, to manufacture the thin film transistor described above. The method comprises: successively forming an active region, a gate insulating layer, a gate, a source and a drain, and a passivation layer on a flexible substrate; forming a protective layer on the passivation layer; and forming a planarization layer on the protective layer, wherein the protective layer is located right above the active region and the gate.

Accordingly, the present invention also provides a display panel comprising the thin film transistor described above.

Accordingly, the present invention also provides a display apparatus comprising the display panel described above.

Compared with the prior art, the thin film transistor and the manufacturing method thereof, the display panel, and the display apparatus according to the present invention have the following beneficial effects:

1. A protective layer is formed between the passivation layer and the planarization layer of the thin film transistor, and located right above the active region and the gate, to protect the semiconductor material within a perpendicular area covered by the protective layer. Therefore, the stress on part of the materials of the thin film transistor is reduced during bending, and damage to the semiconductor material is avoided during bending of the thin film transistor device, thus improving the quality of the device.

2. When the protective layer is made of metal, the protective layer covers the active region, the gap between the gate and the source as well as the gap between the gate and the drain in the direction perpendicular to the gate. Because the material of the gate also has good support property, the structure in which the protective layer and the gate overlap can also protect the semiconductor material on the lower side. Moreover, because the protective layer and the gate have a small overlapping area, an effect of the protective layer on the thin film transistor caused by the parasitic capacitance can be reduced.

DETAILED DESCRIPTION

In order to make the content of the present invention clearer and easier to understand, the content of the present invention will be further described below with reference to the accompanying drawings of the specification. Apparently, the present invention is not limited to specific embodiments, and general substitutions known to those skilled in the art also fall within the protection scope of the present invention.

Secondly, the present invention is described in detail using schematic diagrams. In the detailed description of the examples of the present invention, for convenience of explanation, the diagrams are not partially enlarged according to the general scale, which should not be construed as limitation to the present invention.

The core idea of the present invention lies in that, a protective layer is formed between a passivation layer and a planarization layer of a thin film transistor, and located right above an active region and a gate, to protect the semiconductor material within a perpendicular area covered by the protective layer. Therefore, the stress on part of the materials of the thin film transistor is reduced during bending, and damage to the semiconductor material is avoided during bending of the thin film transistor device, thus improving the quality of the device.

Embodiment 1

Figure 1:
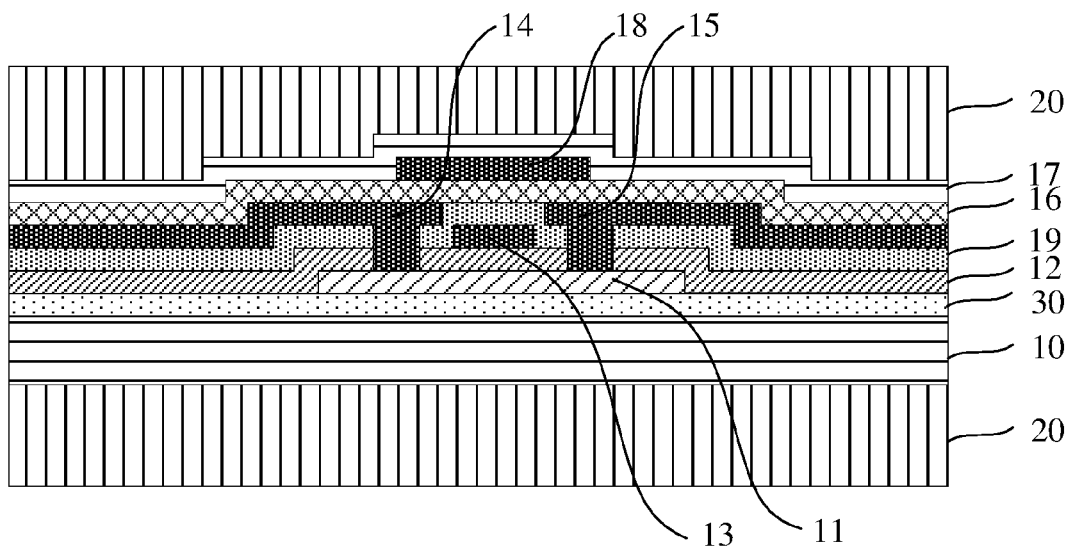
FIG. 1 is a schematic structural diagram of a thin film transistor according to an embodiment of the present invention.

FIG. 1 is a schematic structural diagram of a thin film transistor according to an embodiment of the present invention. As shown in FIG. 1, the thin film transistor according to this embodiment comprises an active region 11, a gate insulating layer 12, a gate 13, a source 14 and a drain 15, a passivation layer 16, and a planarization layer 17 that are successively formed on a flexible substrate 10, where a protective layer 18 is formed between the passivation layer 16 and the planarization layer 17, and located right above the active region 11 and the gate 13.

As can be seen from FIG. 1, the protective layer 18 is located right above the active region 11 and the gate 13, and completely covers the gate 13 in a direction perpendicular to the gate 13. Preferably, in addition to completely covering the gate 13 in the perpendicular direction, the protective layer 18 can further at least (preferably, completely) cover areas corresponding to the gap between the gate 13 and the source 14, as well as the gap between the gate 13 and the drain 15. The material of the protective layer 18 is an organic material or metal, or may also be another material known to persons skilled in the art. The protective layer 18 protects a semiconductor material of the thin film transistor in a perpendicular area of the protective layer 18. Therefore, the stress on part of the materials of the thin film transistor is reduced during bending, and damage to the semiconductor material is avoided during bending of the thin film transistor device, thus improving the quality of the device.

Preferably, the Young's modulus of the protective layer 18 is greater than 300 $N/m^2$, for example, 350 $N/m^2$, 400 $N/m^2$, 450 $N/m^2$, or 500 $N/m^2$. Thus, the stress on the part of the thin film transistor below the protective layer 18 can be effectively reduced during bending.

Figure 2:
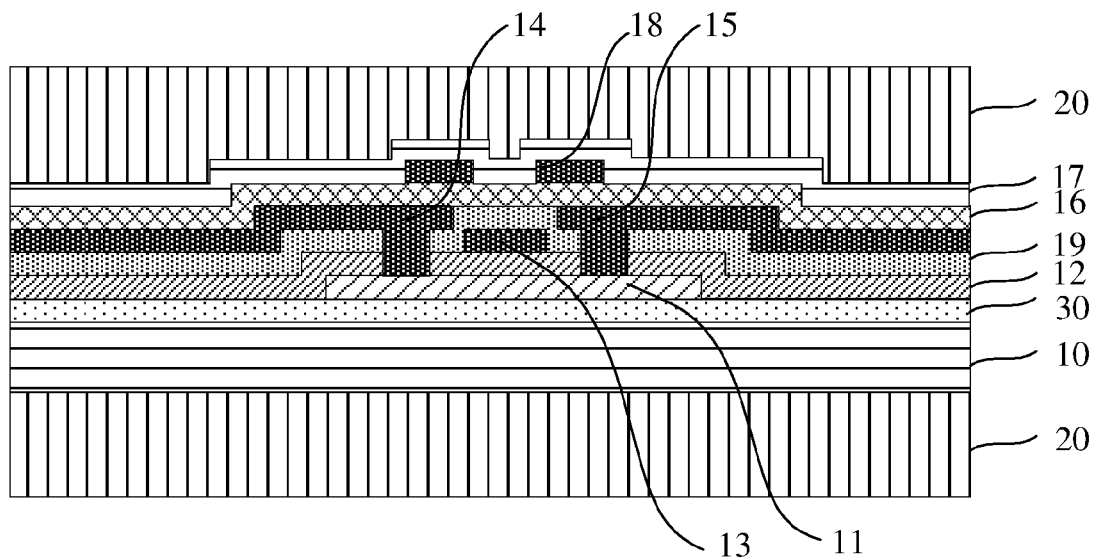
FIG. 2 is a schematic structural diagram of another thin film transistor according to an embodiment of the present invention.

When the protective layer 18 is made of metal, parasitic capacitance may be generated between the metal protective layer and the gate 13, thus affecting the performance of the thin film transistor. Therefore, in another structural solution of the thin film transistor, an overlapping area between the metal protective layer and the gate 13 may be reduced by all methods. As shown in FIG. 2, the protective layer 18 is made of metal. The protective layer 18 covers part of the active region 11 in a direction perpendicular to the gate 13, and completely covers the gap between the gate 13 and the source 14, as well as the gap between the gate 13 and the drain 15. Because the gate 13 is also made of metal, itself can have good support property, and therefore, the protective layer 18 may be mainly used to protect the gap areas between the gate 13 and the source 14, as well as between the gate 13 and the drain 15. In the structure shown in FIG. 2, the protective layer 18 and the gate 13 may have a very small overlapping area in the perpendicular direction. The structure in which the protective layer 18 and the gate 13 (both are made of metal) overlap can protect the semiconductor material on the lower side. Moreover, because the protective layer 18 and the gate 13 have a relatively small overlapping area, the parasitic capacitance can be controlled within an acceptable range, for example, the parasitic capacitance is controlled to be less than a preset threshold, thus lowering an effect of the parasitic capacitance on the thin film transistor.

The thin film transistor further comprises: an upper protective film 20, a lower protective film 20, and a barrier film 30. The upper protective film 20 is provided over the planarization layer 17, and the lower protective film 20 is provided below the flexible substrate 10. The barrier film 30 is provided between the flexible substrate 10 and the gate insulating layer 12, to insulate against water and oxygen molecules. In addition, an interlayer insulating layer 19 is further formed in the structure shown in FIG. 1 and FIG. 2, and the interlayer insulating layer 19 covers the gate 13.

It can be understood that, based on the conventional thin film transistor, the thin film transistor according to the present invention has a protective layer formed between a passivation layer and a planarization layer, to protect a semiconductor material on the lower side. Therefore, components of the thin film transistor are merely described briefly.

Embodiment 2

The present invention provides a method for manufacturing the thin film transistor described in Embodiment 1. The method comprises: successively forming an active region 11, a gate insulating layer 12, a gate 13, a source 14 and a drain 15, and a passivation layer 16 on a flexible substrate 10, wherein a protective layer 18 is formed on the passivation layer 16, and a planarization layer 17 is formed on the protective layer 18, the protective layer 18 being located right above the active region 11 and the gate 13. Finally, the structure shown in FIG. 1 or FIG. 2 is formed.

The protective layer 18 protects a semiconductor material of the thin film transistor in a perpendicular area of the protective layer 18. Therefore, the stress on part of the materials of the thin film transistor is reduced during bending, and damage to the semiconductor material is avoided during bending of the thin film transistor device, thus improving the quality of the device.

The protective layer 18 is made into different structures described in Embodiment 1 according to different protective layer materials, as shown in FIG. 1 and FIG. 2 respectively.

Embodiment 3

This embodiment provides a display panel, which comprises the thin film transistor described in Embodiment 1.

The display panel of this embodiment has the thin film transistor described in Embodiment 1. Therefore, a protective layer is formed between a passivation layer and a planarization layer of the thin film transistor, and located right above an active region and a gate, to protect the semiconductor material within a perpendicular area covered by the protective layer. Therefore, the stress on part of the materials of the thin film transistor is reduced during bending, and damage to the semiconductor material is avoided during bending of the thin film transistor device, thus improving the quality of the device. When the protective layer is made of metal, the protective layer covers part of the active region, and completely covers the gap between the gate and the source as well as the gap between the gate and the drain in a direction perpendicular to the gate. Because the material of the gate also has good support property, the structure in which the protective layer and the gate overlap can also protect the semiconductor material on the lower side. Moreover, because the protective layer and the gate have a small overlapping area, an effect of the parasitic capacitance on the thin film transistor can be reduced.

Embodiment 4

This embodiment provides a display apparatus, which comprises the display panel described in Embodiment 3.

The display apparatus of this embodiment has the display panel described in Embodiment 3. Therefore, a protective layer is formed between a passivation layer and a planarization layer of the thin film transistor, and located right above an active region and a gate, to protect the semiconductor material within a perpendicular area covered by the protective layer. Therefore, the stress on part of the materials of the thin film transistor is reduced during bending, and damage to the semiconductor material is avoided during bending of the thin film transistor device, thus improving the quality of the device. When the protective layer is made of metal, the protective layer covers part of the active region, and completely covers the gap between the gate and the source as well as the gap between the gate and the drain in a direction perpendicular to the gate. Because the material of the gate also has good support property, the structure in which the protective layer and the gate overlap can also protect the semiconductor material on the lower side. Moreover, because the protective layer and the gate have a small overlapping area, an effect of the protective layer on the thin film transistor caused by the parasitic capacitance can be reduced.

To sum up, in the thin film transistor and the manufacturing method thereof, the display panel, and the display apparatus according to the present invention, a protective layer is formed between a passivation layer and a planarization layer of the thin film transistor, and located right above an active region and a gate, to protect the semiconductor material within a perpendicular area covered by the protective layer. Therefore, the stress on part of the materials of the thin film transistor is reduced during bending, and damage to the semiconductor material is avoided during bending of the thin film transistor device, thus improving the quality of the device. When the protective layer is made of metal, the protective layer covers part of the active region, and completely covers the gap between the gate and the source as well as the gap between the gate and the drain in a direction perpendicular to the gate. Because the material of the gate also has good support property, the structure in which the protective layer and the gate overlap can also protect the semiconductor material on the lower side. Moreover, because the protective layer and the gate have a small overlapping area, an effect of the parasitic capacitance on the thin film transistor can be lowered.

The above merely describes the preferred embodiments of the present invention and is not intended to limit the scope of the present invention. Any changes and modifications made by persons of ordinary skill in the art according to the above disclosure all fall within the protection scope of the claims.

What is claimed is:

1. A thin film transistor, comprising an active region, a gate insulating layer, a gate, a source and a drain, a passivation layer, and a planarization layer that are successively formed on a flexible substrate, wherein a protective layer is provided between the passivation layer and the planarization layer, the protective layer located right above the active region and the gate, and wherein the protective layer is made of metal and covers part of the active region in a direction perpendicular to the gate, the protective layer completely covering a gap between the gate and the source as well as a gap between the gate and the drain, and not completely covering the gate.

2. The thin film transistor of claim 1, wherein the protective layer has a Young's modulus of greater than 300 $N/m^2$.

3. The thin film transistor of claim 1, further comprising: an upper protective film, a lower protective film, and a barrier film, wherein the upper protective film is provided over the planarization layer, the lower protective film is provided below the flexible substrate, and the barrier film is provided between the flexible substrate and the gate insulating layer.

4. A method for manufacturing the thin film transistor described in claim 1, comprising: successively forming an active region, a gate insulating layer, a gate, a source and a drain, and a passivation layer on a flexible substrate; forming a protective layer on the passivation layer; and forming a planarization layer on the protective layer, wherein the protective layer is located right above the active region and the gate.

5. A display panel, comprising the thin film transistor described in claim 1.

* * * * *